(12) United States Patent
Grodzki

(10) Patent No.: US 9,081,072 B2
(45) Date of Patent: Jul. 14, 2015

(54) MAGNETIC RESONANCE METHOD AND SYSTEM TO GENERATE AN IMAGE DATA SET

(75) Inventor: David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 957 days.

(21) Appl. No.: 13/249,900

(22) Filed: Sep. 30, 2011

(65) Prior Publication Data

US 2012/0081113 A1    Apr. 5, 2012

(30) Foreign Application Priority Data

Sep. 30, 2010 (DE) .......................... 10 2010 041 801

(51) Int. Cl.
- *G01V 3/00* (2006.01)
- *G01R 33/48* (2006.01)
- *G01R 33/561* (2006.01)

(52) U.S. Cl.
CPC .......... *G01R 33/4816* (2013.01); *G01R 33/561* (2013.01); *G01R 33/4824* (2013.01)

(58) Field of Classification Search
CPC .................................................... G01R 33/561
USPC ........... 324/309, 307, 306, 314, 312; 600/410
See application file for complete search history.

(56) References Cited

U.S. PATENT DOCUMENTS

| | | | |
|---|---|---|---|
| 5,510,710 A | 4/1996 | Nauerth | |
| 5,952,827 A * | 9/1999 | Feinberg | ........................ 324/309 |
| 8,604,785 B2 * | 12/2013 | Deimling et al. | ............. 324/307 |
| 8,873,820 B2 * | 10/2014 | Grodzki | ........................ 382/131 |
| 2011/0215804 A1 * | 9/2011 | Deimling et al. | ............. 324/307 |

OTHER PUBLICATIONS

"Single Point Sequences With Shortest Possible TE—Gospel," Grodzki et al., Magnetic Resonance, Siemens Healthcare, Erlangen, Germany, Department of Experimental Physics 5, University of Würzburg, Germany Proc. Intl. Soc. Mag. Reson. Med., vol. 18, (2010) p. 2977.

"Rapid Single Point (RASP) Imaging," Heid et al., Institute of Diagnostic Radiology, University of Bern, Siemens Medical Engineering, $3^{rd}$ Annual Meeting (1995), p. 684.

"Single-Point Imaging With a Variable Phase Encoding Interval," Latta et al., Magnetic Resonance Imaging, vol. 26, (2008) pp. 109-116.

"3D Radial Projection Technique With Ultrashort Echo Times for Sodium MRI: Clinical Applications in Human Brain and Skeletal Muscle," Nielles-Vallespin et al., Magnetic Resonance in Medicine, vol. 57 (2007) pp. 74-81.

* cited by examiner

Primary Examiner — Louis Arana
(74) Attorney, Agent, or Firm — Schiff Hardin LLP

(57) ABSTRACT

In a magnetic resonance method and system to generate an image data set with a magnetic resonance system at least two phase coding gradients are activated in respective spatial directions. An RF excitation pulse is radiated. At least one raw data point in a k-space data set belonging to the image data set is read out per time period after the radiation of the RF excitation pulse. The time period for each raw data point is determined depending on a maximum strength achievable with the magnetic resonance system of the activated phase coding gradient that corresponds to the spatial direction in which the respective raw data point has the largest gradient moment in terms of absolute value. The maximum strength of this phase coding gradient that can be achieved with the magnetic resonance system is determined depending on the determined largest gradient moment.

11 Claims, 5 Drawing Sheets

FIG 1
(Prior art)
a)
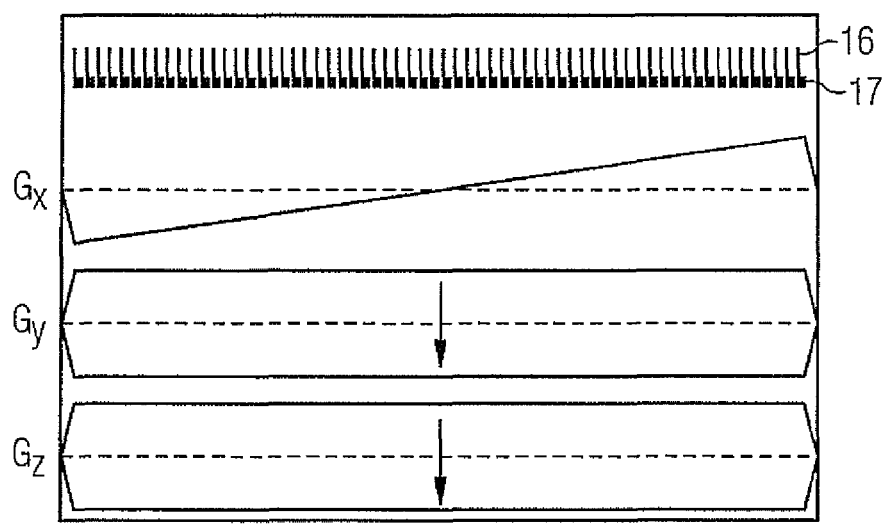
b)
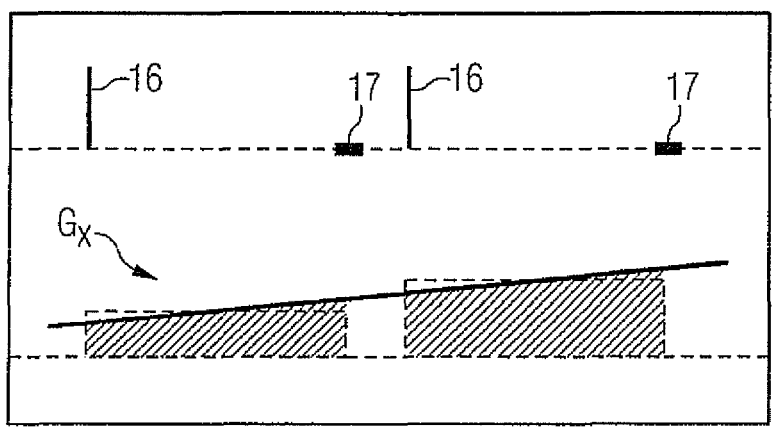

MAGNETIC RESONANCE METHOD AND SYSTEM TO GENERATE AN IMAGE DATA SET

BACKGROUND OF THE INVENTION

1. Field of the Invention

The present invention concerns a method in order to generate an image data set with a magnetic resonance system. Moreover, the present invention concerns correspondingly designed magnetic resonance system as well as a corresponding electronically readable data storage medium.

2. Description of the Prior Art

Magnetic resonance tomography offers new fields of application via an acquisition of MR data with very short echo times (<500 µs). It is thereby possible to show substances or tissue which cannot be shown by means of conventional sequences—for example a (T)SE sequence ("(Turbo) Spin Echo") or a GRE sequence ("Gradient Echo")—since their T2 time is markedly shorter than the echo time, and thus a corresponding signal from these substances or tissues has already decayed at the point in time of the acquisition. For example, with echo times which lie within the range of the corresponding decay time it is possible to show bones, teeth or ice in an MR image although the T2 time of these objects lies in a range from 30-80 µs.

Sequences are known that enable a very short echo time. In addition to the radial UTE sequence ("Ultrashort Echo Time"), there is the approach to scan k-space in points with the free induction decay (FID) being detected. Such a method is also designated as single point imaging since essentially only one raw data point in k-space is acquired per RF excitation.

One example of such a method for single point imaging is the RASP method ("Rapid Single Point (RASP) Imaging", O. Heid, M. Deimling, SMR, 3rd Annual Meeting, Page 684, 1995). According to the RASP method, a raw data point whose phase was coded by gradients is read out at a fixed point in time after the RF excitation relative to the echo time TE. The gradients are modified by means of the magnetic resonance system for each raw data point or measurement point, and thus k-space is scanned point by point as is shown in FIGS. 1a and 1b.

SUMMARY OF THE INVENTION

An object of the present invention is to create an image data set with a magnetic resonance system, wherein the echo time is additionally shorted relative to the prior art.

The above object is achieved in accordance with the present invention by a method to generate an image data set with a magnetic resonance system, that includes the following steps.

At least two phase coding gradients are activated (switched) in respective spatial directions.

An RF excitation pulse is radiated.

At least one raw data point in a k-space data set belonging to the image data set is read out per time period after the radiation of the RF excitation pulse, wherein the time period for each raw data point is determined depending on a maximum strength (achievable with the magnetic resonance system) of the activated phase coding gradient that corresponds to the spatial direction in which the respective raw data point has the largest gradient moment in terms of absolute value. The maximum strength of this phase coding gradient that can be achieved with the magnetic resonance system is determined depending on the determined largest gradient moment.

The decisive advantage of the present invention is that each raw data point is detected with the minimum echo time (the predetermined time period) that was determined for it individually. Because a constant echo time is not used (as has been typical in the prior art), substances that could not previously be shown can now be shown in an MR image. Moreover, the time to acquire an MR image is advantageously reduced relative to the prior art. The strengths of the phase coding gradients can be maximized corresponding to their spatial direction by the determination of the maximum strength of the phase coding gradient that can be achieved with the magnetic resonance system in the spatial direction that corresponds to the largest gradient moment of the respective raw data point, depending on the determined largest gradient moment. Thus the required echo times are additionally reduced compared to the use of global (i.e., not spatial direction-dependent) maximum values for the phase coding gradient strengths.

In one embodiment, three phase coding gradients ($G_x$, $G_y$, $G_z$) are switched respectively in different spatial directions and multiple raw data points are acquired along a straight-line spoke that runs through the center of k-space. As described in detail below, the time period after which the corresponding raw data point is read out normally depends on the strongest of the three phase coding gradients for this raw data point. This means that in the case of a radial readout method, multiple raw data points lying on a spoke running through the center of k-space can advantageously be acquired with only one RD excitation pulse, since the time periods or echo times to be maintained for the respective raw data points have different dependencies on the distance of the corresponding raw data point from the center.

When, after an RF excitation pulse, multiple raw data points are acquired on a spoke running through the k-space center, the method can be accelerated since fewer RF excitation pulses are required in order to scan the same k-space than if only one raw data point were acquired after an RF excitation pulse. Since the raw data points acquired after a common RF excitation pulse lie on the same spoke, all raw data points have different strengths for each of their three phase coding gradients if it is assumed that these raw data points lie on the spoke on the same side of the k-space center. Due to the different strengths of their three phase coding gradients, the raw data points lying on the same spoke also have different echo times, such that the raw data points can be acquired at different times. Moreover, the relationship of the strengths of the phase coding gradients of a raw data point is constant for all raw data points on the same spoke. (This means that the ratios $G_x/G_y$, $G_x/G_z$ and $G_y/G_z$ are the same for all raw data points of the same spoke.). If the three phase coding gradients of the raw data points to be acquired simultaneously are multiplied with the same factor, such that the respective strongest phase coding gradient has the maximum strength, all raw data points to be acquired after a common RF excitation pulse are spatially coded with the same activated phase coding gradient, and therefore can be acquired with the same RF excitation pulse.

In a scanning method operating in a Cartesian manner (for example as can be used in the method according to the invention), the raw data points are acquired line by line, with essentially only one phase coding gradient changing between two adjacent raw data points. For this reason it frequently occurs that two adjacent raw data points have the same echo time since the phase coding gradient which determines the echo time is the same for the adjacent raw data points. Therefore the two adjacent raw data points would have to be read out at the same time period after the RF excitation pulse, which is why they cannot be read out with the same RF excitation pulse in this case. Moreover, given a scanning method operating in a Cartesian manner the case rarely arises that the ratio of the phase coding gradients of two raw data points to be scanned in succession remains constant. Therefore, in most cases two adjacent raw data points can also not be acquired with the same phase coding gradients when these phase coding gradients have previously been multiplied with the same factor such that the respective strongest phase coding gradient has the maximum gradient strength.

The k-space data set belonging to the image data set is in each case populated with raw data points ($K_x$, $K_y$, $K_z$) such that the Nyquist theorem is satisfied. In order to satisfy the Nyquist theorem, the following Equation (1) must be satisfied:

$$K_{max,i} - K_{min,i} \geq \frac{\gamma \times N_i}{FoV_i} \quad (1)$$

where i as an index standing for one of the three spatial directions (x, y or z), $K_{max,i}$ and $K_{min,i}$ respectively stand for the maximum and minimum gradient moment of the corresponding spatial direction. The gradient moment $K_i$ to be set to acquire a raw data point must lie between these two extreme values ($K_{min,i}$, $K_{max,i}$).

The following Equation (2) then normally applies for the step width $\delta K_i$ of the gradient moment $K_i$ of the respective spatial direction:

$$\delta K_i = \frac{K_{max,i} - K_{min,i}}{(N_i - 1)} \quad (2)$$

The (still unknown) echo time TE is the same for all spatial directions, and the following Equation (3) applies for the relationship between echo time TE and the gradient moments ($K_x$, $K_y$, $K_z$) and the gradient strength of the phase coding gradients in the corresponding spatial direction ($G_x$, $G_y$, $G_z$):

$$TE = \frac{K_i}{G_i} \quad (3)$$

wherein i as an index again standing for one of the three spatial directions (x, y or z). As is apparent from Equation (3), the echo time TE is smaller the greater the strength of the gradient and, if the strength of a phase coding gradient is provided, the echo time is established, and the remaining strengths of the remaining phase coding gradients can be determined from the respective gradient moments and the echo time.

Furthermore, from Equation (3) it is clear that, for a minimal echo time TE, that phase coding gradient which corresponds to that spatial direction in which the largest (in terms of absolute value) gradient moment exists must be made as large as possible.

For the largest (in terms of absolute value) gradient moment $K_{max(i)}$, the relationship $|K_{max(i)}| \geq K_i$ applies, wherein the index "max(i)" stands for the spatial direction (x, y, z) in which the largest (in terms of absolute value) gradient moment of the respective raw data point is present, and in which the largest phase coding gradient $G_{max(i)}$ should thus also be applied, in order to minimize the echo time that extends until after the radiation of the RF excitation pulse of the corresponding raw data point.

In the method according to the invention, to acquire at least one raw data point this phase coding gradient $G_{max(i)}$ is set to a maximum strength in the respective spatial direction, which can be determined depending on the gradient moment $K_{max(i)}$. After determining $G_{max(i)}$, the echo time TE can thus be calculated as $$TE = \frac{K_{max(i)}}{G_{max(i)}}. \quad (4)$$

The maximum strength of the phase coding gradient $G_{max(i)}$ that is possible in the spatial direction max(i) is limited by the magnetic resonance system such that the gradient G obtained by superimposing the activated gradients ($G_x$, $G_y$, $G_z$)—thus $G = \sqrt{G_x^2 + G_y^2 + G_z^2}$ (5)—does not exceed this maximum gradient strength predetermined by the hardware of the magnetic resonance system.

For example, for this purpose it can be the case that $G \leq G_{nom} \sqrt{3}$ must be true, wherein $G_{nom}$ corresponds to the nominal maximum gradient strength of the magnetic resonance system, and therefore $G_{nom} \sqrt{3}$ corresponds to the maximum gradient strength possible with the magnetic resonance system in an arbitrary (thus inclined) spatial direction.

By using Equations (3) and (4) in (5), the following is obtained:

$$G = \sqrt{K_x^2 + K_y^2 + K_z^2} / TE = \sqrt{K_x^2 + K_y^2 + K_z^2} * \frac{G_{max(i)}}{K_{max(i)}}.$$

If the maximum value for arbitrary spatial directions $G = G_{nom} \sqrt{3}$ that is provided by the magnetic resonance system is now used for G, $$G_{max(i)} = \frac{K_{max(i)}}{\sqrt{K_x^2 + K_y^2 + K_z^2}} * G_{nom} \sqrt{3} \quad (6)$$

is obtained for $G_{max(i)}$.

A maximum gradient strength of the phase coding gradient in the direction max(i) that is calculated in this way utilizes the existing gradient system for magnetic resonance system particularly effectively since an individual, maximum gradient strength of the phase coding gradient in the direction max(i) is calculated for each raw data point depending on its gradient moment.

Because, except for in the center of k-space, one of the phase coding gradients is always switched to a maximum level, the echo time (specifically in proximity to the k-space center) decreases to a value limited by the hardware of the magnetic resonance system, so that the depiction of bones is also possible, for example.

Assuming the echo time TE which can be determined after determining $G_{max(i)}$ according to Equation (4), the strength of each additional phase coding gradient $G_i$—with $i \neq max(i)$—is determined according to the following Equation (7):

$$G_i = \frac{K_i}{TE}, \quad (7)$$

wherein $K_i$ corresponds to the gradient moment of the corresponding spatial direction.

The phase coding gradients are advantageously already switched—meaning that they have their final value—when the RF excitation pulse is radiated.

Since the nominal minimum echo time is provided by the magnetic resonance system (for example by minimum switch-over times required by the hardware of the magnetic resonance system between the radiation of an RF excitation pulse and preparation for the reception of echo signals), this nominal minimum echo time cannot be under-run. If a determination of the predetermined time period or echo time yields an echo time after the procedure described in the preceding—which echo time is smaller than the nominal minimum echo time provided by the magnetic resonance system—the MR data are acquired after the radiation of the RF excitation pulse in spite of the nominal minimum echo time.

The present invention also encompasses a magnetic resonance system is also provided to generate an image data set according to the described method. The magnetic resonance system has an activation unit to activate a gradient coil system of a data acquisition unit (scanner) of the magnetic resonance system, a reception device to receive signals acquired by the scanner, and an evaluation device to evaluate the signals and create the image data set.

The advantages of the magnetic resonance system according to the invention essentially correspond to the advantages of the method according to the invention that have been stated in detail above.

Furthermore, the present invention encompasses a non-transitory, computer-readable data storage medium encoded with control commands (programming instruction) such as software, which can be loaded into a memory of a programmable controller or a computer of a magnetic resonance system. All or various embodiments of the method according to the invention as are described in the preceding can be executed by implementing the programming instructions by the controller. The programming instructions may possibly require items such as libraries and auxiliary functions, for example, in order to realize the corresponding embodiments of the method. The software can be source code (C++, for example) that must still be compiled and linked or that only must be interpreted, or can be executable software code that has only to be loaded into the corresponding computer for execution.

The electronically readable data storage medium may be, for example a DVD, a magnetic tape or a USB stick—on which is stored electronically readable control information, in particular software (see above).

The present invention has the following advantages:

Very short echo times, essentially limited only by the hardware.

The possibility to be able to show substances or tissue with very short echo times.

Effective, individual utilization of the existing gradient system of the magnetic resonance system for each raw data point.

A reduction of the measurement time in comparison to the RASP method since the repetition time can decrease with the echo time.

The present invention is suitable for methods of single point imaging, wherein essentially one raw data point is acquired per radiated RF excitation pulse. Given radial data acquisition methods, the present invention is also suitable for acquisition of multiple raw data points per RF excitation pulse. However, the present invention is naturally not limited to these preferred fields of application since, for example, multiple raw data points can be acquired with one RF excitation pulse—even given non-radial acquisition methods or, respectively, methods according to the invention—if the Nyquist theorem is maintained per raw data point.

BRIEF DESCRIPTION OF THE DRAWINGS

The RASP method known according to the prior art is described in FIGS. 1a and 1b.

DESCRIPTION OF THE PREFERRED EMBODIMENTS

A sequence to acquire a line in k-space is shown in FIG. 1a. It is apparent that the two phase coding gradients $G_y$ and $G_z$ are activated with a constant strength while the strength of the third phase coding gradient $G_x$ increases continuously.

The acquisition of two raw data points is shown in detail in FIG. 1b. It is apparent that the echo time—i.e. the time interval from the RF excitation pulse 16 until the beginning of the readout time period 17—is constant. Moreover, the phase coding gradient $G_x$ runs in stages from bottom to top. The phase coding gradient $G_x$ to readout a raw data point is thereby kept constant, which means that the phase coding gradient $G_x$ is kept constant for the time period TE (echo time).

Figure 2:
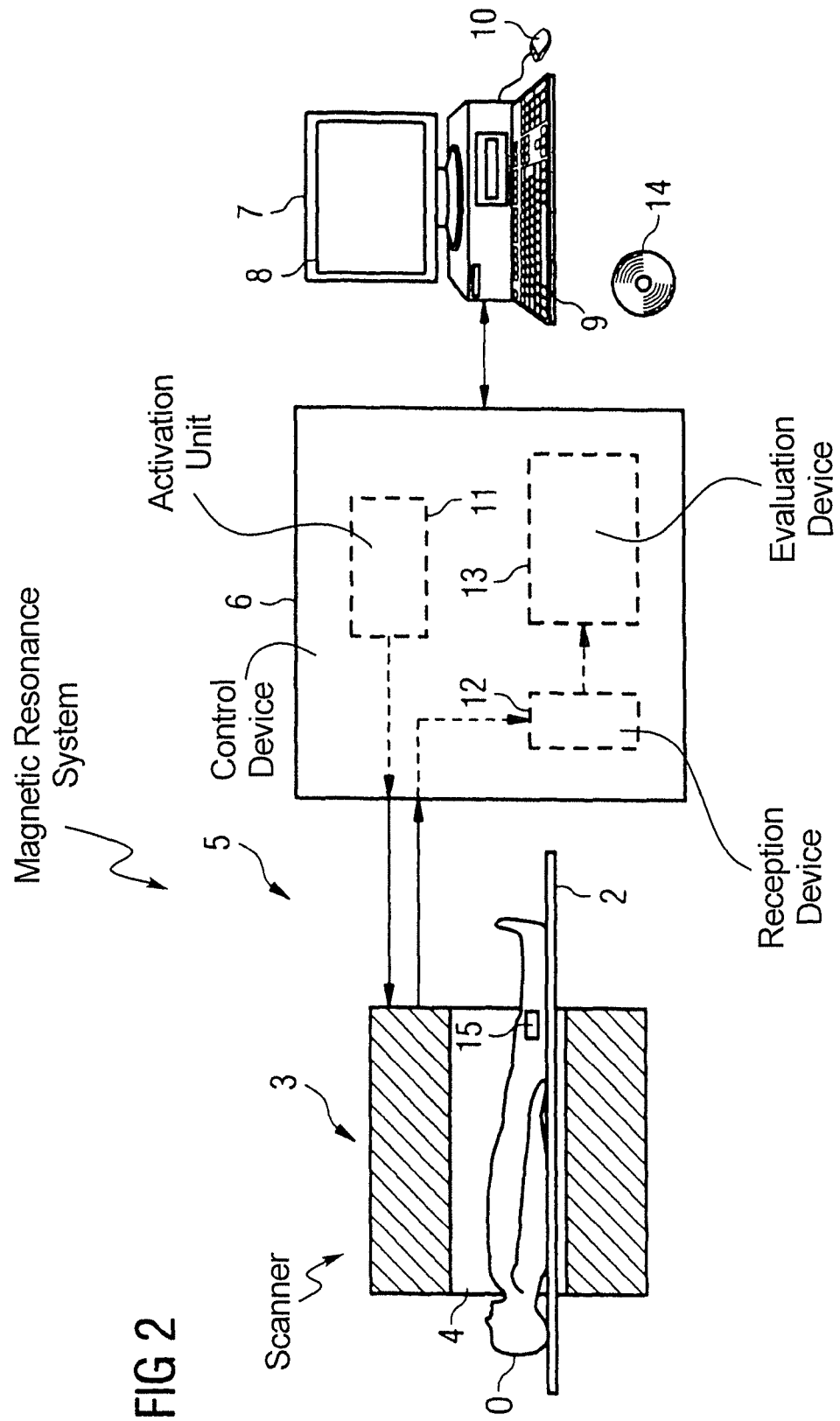
FIG. 2 schematically shows a magnetic resonance system according to the invention.

A magnetic resonance system 5 according to the invention is schematically shown in FIG. 2. The magnetic resonance system 5 has an MR data acquisition unit (scanner) 3 with which the magnetic field necessary for the MR examination is generated in a measurement space 4, a patient table 2, a control device 6 with which the scanner 3 is controlled and MR data are received from the scanner 3, and a terminal 7 connected to the control device 6.

The control device 7 includes an activation unit 11, a reception device 12 and an evaluation device 13. During the generation of an image data set, MR data are received by the reception device 12 from the scanner 3, with the scanner 3 and the patient table 2 being controlled by the activation unit 11 such that MR data are acquired in a measurement volume 15 which is located inside the body of a patient O lying on the table 2.

The evaluation device 13 then prepares the MR data such that they can be graphically presented on a monitor 8 of the terminal 7, and such that images according to the invention can be displayed. In addition to the graphical presentation of the MR data, with the terminal 7 (which comprises a keyboard 9 and a mouse 10 in addition to the monitor 8) a three-dimensional volume segment to be measured can be provided by a user, for example, and additional parameters can be defined for implementation of the method according to the invention. The software for the control device 6 can also be loaded into the control device 6 via the terminal 7. This software of the control device 6 can cause execution of the method according to the invention. The method according to the invention may also be embodied in a software that runs in the terminal 7. Independently of where the software for executing the method according to the invention is located, the software can be stored on a DVD 14 so that this software can then be read by the terminal 7 from the DVD 14 and either be copied into the control device 6 or into a computer of the terminal 7 itself.

Figure 3:
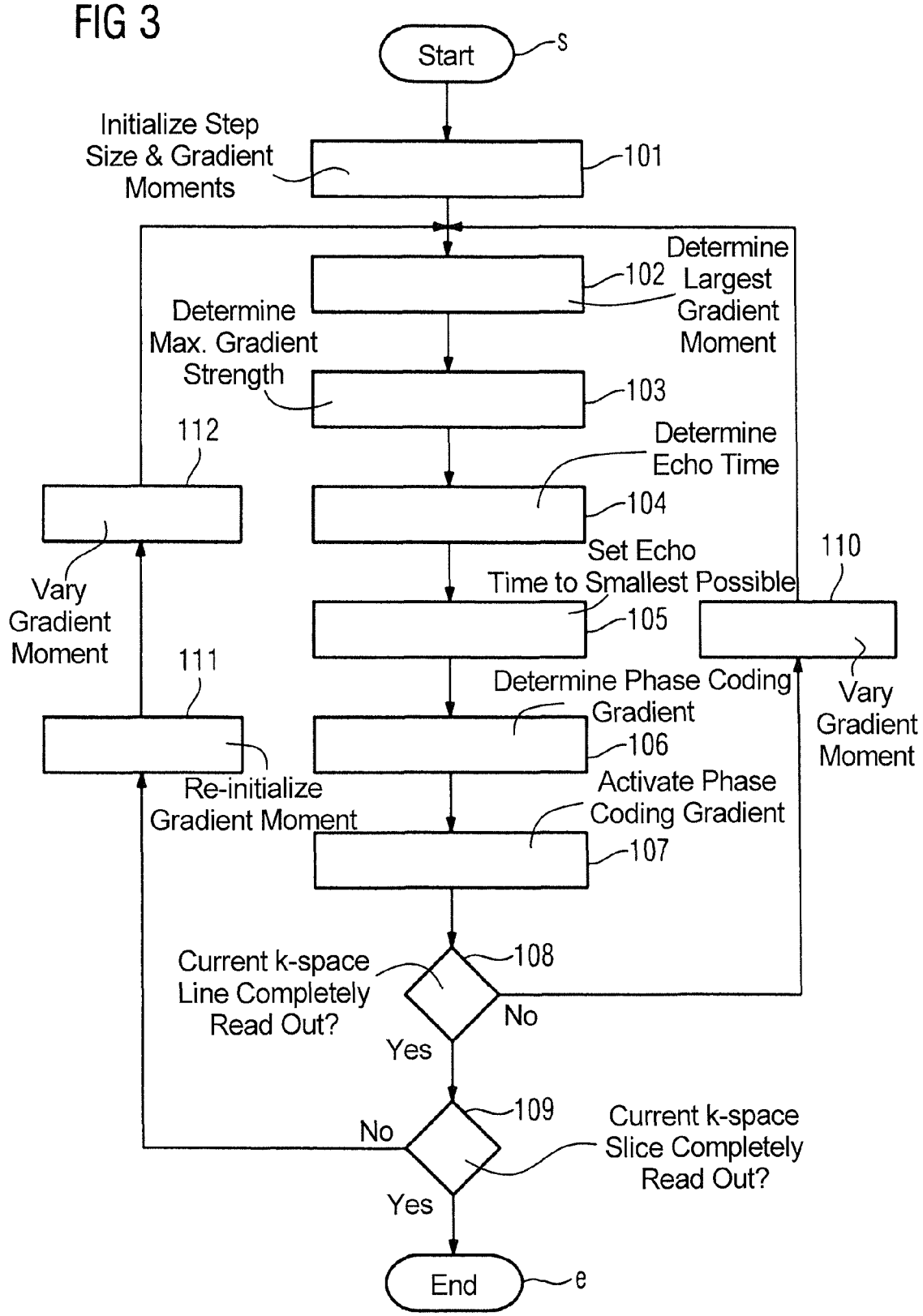
FIG. 3 is a flow chart of an embodiment according to the invention to create an image data set.

A flow chart for the method according to the invention for the generation of an image data set by means of a magnetic resonance system 5 is schematically depicted in FIG. 3 with a start s and an end e, wherein the shown flow chart describes the readout of a slice. The method shown in FIG. 3 operates with a slice selection (without limitation of the generality in the z-direction) so that only two phase coding gradients $G_x$ and $G_y$ are used for spatial coding within the selected slice.

In the first Step 101 the step sizes $\delta K_x$ and $\delta K_y$ are initialized and the gradient moments $K_x$ and $K_y$ are initialized for the first raw data point to be acquired in k-space.

In the second Step 102 the largest (in terms of absolute value) of the initialized gradient moments $K_{max(i)}$ (with $|K_{max(i)}| \geq |K_x|$ and $|K_{max(i)}| \geq |K_y|$), and therefore also the spatial direction max(i), are determined via suitable comparisons of the absolute values of the initialized gradient moments $K_x$ and $K_y$.

According to Step 103, the maximum gradient strength ($G_{max(i)}$) in the spatial direction max(i) is determined depending on the gradient moment and a nominal maximum gradient strength (predetermined by the magnetic resonance system); this can in particular occur according to Equation (6) indicated above.

In Step 104 the echo time TE (which indicates the time period which extends until the raw data point initialized in Step 101 is read out after an RF excitation pulse) is determined from the maximum gradient strength $G_{max(i)}$ determined in Step 103 in the spatial direction max(i) and the largest (in terms of absolute value) gradient moment $K_{max(i)}$ determined in Step 102, in that the quotient of the two values is calculated according to Equation (4) (specified above).

In Step 105 the echo time determined in Step 104 is set equal to the smallest possible nominal echo time of the magnetic resonance system 5 if it is less than this smallest possible echo time. The echo time determined in this manner is used in the following Steps 106 and 107 to acquire the raw data points.

In Step 106 the phase coding gradient $G_x$, or the phase coding gradient $G_y$, that has not yet been determined is determined by Equation (7), depending on the just determined echo time TE and the corresponding gradient moment $K_x$ or, respectively, $K_y$, with $x \neq max(i)$ or, respectively, $y \neq max(i)$.

In the next Step 107 the two phase coding gradients $G_x$, $G_y$ determined in such a manner are switched. For example, after an RF excitation with slice selection essentially one raw data point is read out after the echo time TE.

In Step 108 it is checked whether the current k-space line has been completely read out. If this is not the case ("n"), in Step 110 the gradient moment $K_x$ is varied accordingly and the method returns to Step 102. If the current k-space line has been completely read out ("y" at Step 108), in Step 109 it is checked whether the k-space slice has also been completely read out. If this is the case ("y"), the method is ended. If the k-space slice has not yet been completely read out ("n" at Step 109), in Step 111 the gradient moment $K_x$ is reinitialized and in Step 112 the gradient moment $K_y$ is varied accordingly and the method returns to Step 102.

If not just two but rather all three phase coding gradients $G_x$, $G_y$ and $G_z$ are activated, as is explained below with reference to FIG. 4, the flow scheme expands analogously to the third spatial direction and more than one raw data point can thus be acquired per pass (i.e. per RF excitation pulse).

Figure 4:
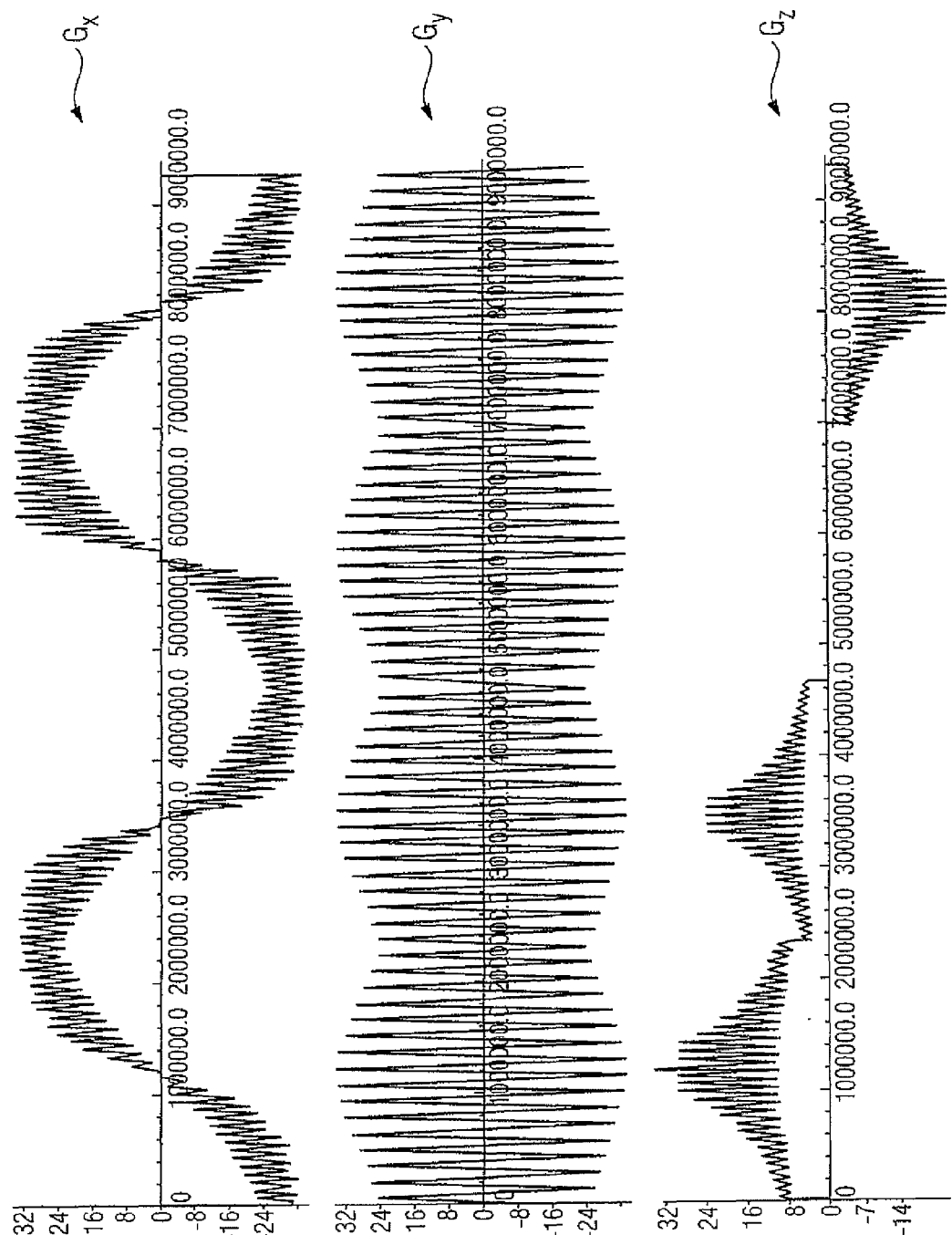
FIG. 4 shows the curve of the three phase coding gradients in the Cartesian acquisition of four slices in k-space.

The course of the three phase coding gradients in the Cartesian acquisition of four slices in k-space scanned in a Cartesian manner is shown in FIG. 4. The associated RF excitation pulses and readout time periods are hereby not shown for reasons of clarity since, in the chosen scale, they would lie so close to one another that they could no longer be depicted. It is noted that, in contrast to the RF excitation pulses 16 and associated readout time periods 17 that are shown in FIG. 1a, here the time intervals between the RF excitation pulses and their associated readout time periods vary corresponding to the determination of the echo time.

In contrast to the method according to the invention that is presented in FIG. 3, the sequence presented in FIG. 4, conforming to a different embodiment of the method according to the invention, does not operate with a slice selection; rather, all three spatial directions (x, y and z) are spatially coded by means of the three phase coding gradients $G_x$, $G_y$ and $G_z$.

As is apparent from FIG. 4, only the phase coding gradient $G_y$ can be activated to the maximum value at the raw data points at the beginning of each k-space line, while the phase coding gradients $G_x$ and $G_z$ have relatively low strengths. Therefore the echo time at the beginning of a k-space line has a relatively long time period in order to not violate the Nyquist theorem (see Equation (1)). The closer that the raw data points to be acquired approach the k-space center, the greater the strength of all three phase coding gradients $G_x$, $G_y$ and $G_z$. Such a point in time is marked by a dashed line in the seventh slice in FIG. 4, for example. The echo time to acquire the raw data points is thus shortest in proximity to the k-space center.

Figure 5:
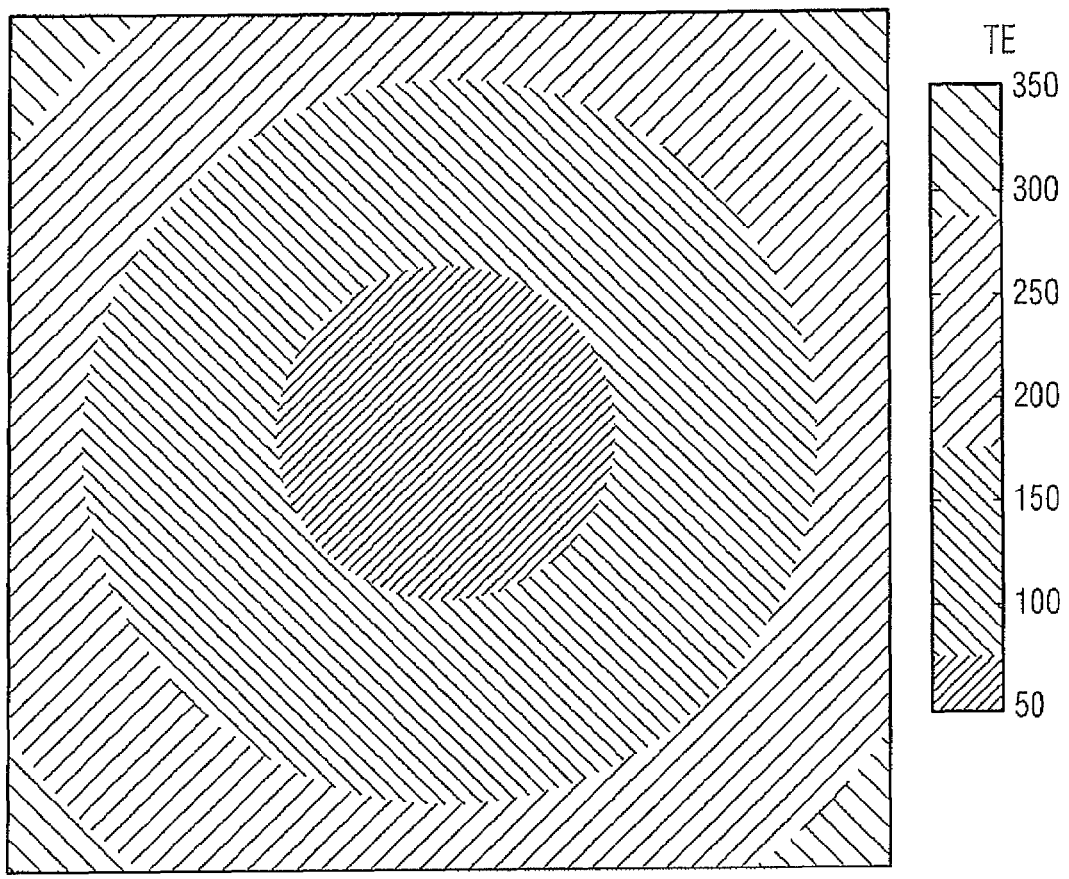
FIG. 5 schematically shows an example of the curve of the echo times TE achieved with the method according to the invention in a slice through k-space.

FIG. 5 schematically shows an example of the curve of the echo times TE achieved with the method according to the invention in a slice through k-space. As is apparent, the echo time TE varies for different k-space points (raw data points), wherein the shortest echo times can be achieved in the region of the k-space center (middle of the image) and the required echo times increase symmetrically to a large extent toward the outer regions (in the direction of higher k-space values).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate an image data set by magnetic resonance imaging, comprising:

operating a gradient coil system, including gradient amplifiers, of a magnetic resonance data acquisition unit to activate at least two phase coding gradients, in respective, different spatial directions;

operating a radio frequency (RF) transmission system of the magnetic resonance data acquisition unit to radiate an RF excitation pulse that excites nuclear spins in an examination subject located in the magnetic resonance data acquisition unit, thereby causing emission of magnetic resonance signals from the examination subject;

operating the magnetic resonance data acquisition unit to read out at least one raw data point, of said magnetic resonance signals, in a k-space data set in a time period following radiation of said RF excitation pulse, and determining said time period for each raw data point dependent on a maximum strength achievable with said gradient coil system for the activated phase coding gradient, among said at least two phase coding gradients, that corresponds to a spatial direction in which the respective raw data point exhibits a largest gradient moment in terms of absolute value, and determining said maximum strength of said phase coding gradient in said spatial direction of said raw data point, that can be achieved with said gradient coil system, dependent on the determined largest gradient moment; and storing said k-space data set in a memory accessible by a processor and, in said processor, converting said k-space data set into an image data set and making said image data set available as a data file at an output of said processor.

2. A method as claimed in claim 1 wherein the step of activating at least two phase coding gradients comprises activating three phase coding gradients in respectively different spatial directions, and acquiring multiple raw data points along a straight-line spoke proceeding through a center of k-space.

3. A method as claimed in claim 1 comprising determining said maximum strength of said phase coding gradient in said spatial direction of the respective raw data point dependent on said gradient moment exhibited by the respective raw data point and a global maximum value of said gradient coil system for the strength of said gradient in said spatial direction of the respective raw data point.

4. A method as claimed in claim 3 comprising determining other phase coding gradients, other than the phase coding gradient in the spatial direction of the respective raw data point, dependent on the gradient moment of the respective raw data point and the determined maximum strength of said phase coding direction in the spatial direction corresponding to the largest gradient moment of the respective raw data point.

5. A method as claimed in claim 1 comprising determining each of said at least two phase coding gradients according to $G_i = K_i/TE$, wherein $K_i$ is the gradient moment in the spatial direction for reading out the respective raw data point, and TE is said time period in which the respective raw data point is read out after radiating said RF excitation pulse.

6. A method as claimed in claim 1 comprising activating phase coding gradients when said RF excitation pulse is radiated.

7. A method as claimed in claim 1 comprising:
determining respective gradient moments for each spatial direction for each raw data point in said k-space data set;
determining a largest gradient moment in terms of absolute value among said determined gradient moments for each of the spatial directions;
determining a maximum strength of the phase coding gradient in the spatial direction corresponding to said largest gradient moment dependent on said gradient moments and a global maximum value of said gradient coil system for a strength of an effective gradient;
acquiring each raw data point by determining a minimum echo time of said magnetic resonance signal, starting from the largest gradient moment determined for the respective raw data point and the determined maximum strength of the associated phase coding gradient; and
determining other phase coding gradients dependent on the gradient moment of the respective spatial direction and the minimum echo time.

8. A method as claimed in claim 7 comprising setting said minimum echo time to a smallest possible echo time of said magnetic resonance data acquisition unit, when the minimum echo time is smaller than said smallest possible echo time of said magnetic resonance data acquisition unit.

9. A method as claimed in claim 1 comprising setting said time period from radiation of said RF excitation pulse until readout of any raw data point to be not less than a limit that is inherent in said magnetic resonance data acquisition unit.

10. A magnetic resonance system to generate an image data set, comprising:
a magnetic resonance data acquisition unit comprising a gradient coil system, including gradient amplifiers, and a radio frequency (RF) transmission system;
a control unit configured to operate said gradient coil system to activate at least two phase coding gradients, in respective, different spatial directions;
said control unit being configured to operate said RF transmission system to radiate an RF excitation pulse that excites nuclear spins in an examination subject located in the magnetic resonance data acquisition unit, thereby causing emission of magnetic resonance signals from the examination subject;
said control unit being configured to operate the magnetic resonance data acquisition unit to read out at least one raw data point, of said magnetic resonance signals, in a k-space data set in a time period following radiation of said RF excitation pulse, and determining said time period for each raw data point dependent on a maximum strength achievable with said gradient coil system for the activated phase coding gradient, among said at least two phase coding gradients, that corresponds to a spatial direction in which the respective raw data point exhibits a largest gradient moment in terms of absolute value, and determining said maximum strength of said phase coding gradient in said spatial direction of said raw data point, that can be achieved with said gradient coil system, dependent on the determined largest gradient moment; and
a processor configured to convert said k-space data set into an image data set and to make said image data set available as a data file at an output of said processor.

11. A non-transitory, computer-readable storage medium encoded with programming instructions, said storage medium being loaded into a computerized control system of a magnetic resonance system, that also comprises a magnetic resonance data acquisition unit comprising a gradient coil system, including gradient amplifiers, and a radio frequency (RE) transmission system, said programming instructions causing said computerized control unit to:
operate said gradient coil system to activate at least two phase coding gradients, in respective, different spatial directions;
operate said RF transmission system to radiate an RF excitation pulse that excites nuclear spins in an examination subject located in the magnetic resonance data acquisition unit, thereby causing emission of magnetic resonance signals from the examination subject;
operate the magnetic resonance data acquisition unit to read out at least one raw data point, of said magnetic resonance signals, in a k-space data set in a time period following radiation of said RF excitation pulse, and determining said time period for each raw data point dependent on a maximum strength achievable with said gradient coil system for the activated phase coding gradient, among said at least two phase coding gradients, that corresponds to a spatial direction in which the respective raw data point exhibits a largest gradient moment in terms of absolute value, and determining said maximum strength of said phase coding gradient in said spatial direction of said raw data point, that can be achieved with said gradient coil system, dependent on the determined largest gradient moment; and
convert said k-space data set into an image data set and make said image data set available as a data file at an output of said processor.

* * * * *